(12) United States Patent
Smith et al.

(10) Patent No.: US 12,431,726 B2
(45) Date of Patent: Sep. 30, 2025

(54) SYSTEMS AND METHODS FOR ACTIVATING AN ELECTRONIC DEVICE VIA BATTERY DISPLACEMENT

(71) Applicant: ZEBRA TECHNOLOGIES CORPORATION, Lincolnshire, IL (US)

(72) Inventors: Cameron James Smith, Whitchurch (GB); Edward Anthony Hackett, Surbiton (GB); Chieh Kai Wang, Taichung (TW); James Roger Morley-Smith, Oxfordshire (GB)

(73) Assignee: Zebra Technologies Corporation, Lincolnshire, IL (US)

( * ) Notice: Subject to any disclaimer, the term of this patent is extended or adjusted under 35 U.S.C. 154(b) by 169 days.

(21) Appl. No.: 18/381,136

(22) Filed: Oct. 17, 2023

(65) Prior Publication Data
US 2025/0125641 A1 Apr. 17, 2025

(51) Int. Cl.
| | |
|---|---|
| *H05K 5/02* | (2006.01) |
| *H01M 10/42* | (2006.01) |
| *H01M 50/202* | (2021.01) |
| *H01M 50/247* | (2021.01) |
| *H01M 50/262* | (2021.01) |
| *H01M 50/289* | (2021.01) |
| *H02J 7/00* | (2006.01) |

(52) U.S. Cl.
CPC ......... *H02J 7/0045* (2013.01); *H01M 10/425* (2013.01); *H01M 50/202* (2021.01); *H01M 50/247* (2021.01); *H01M 50/262* (2021.01); *H01M 50/289* (2021.01); *H05K 5/0221* (2013.01); *H01M 2010/4278* (2013.01); *H01M 2220/30* (2013.01)

(58) Field of Classification Search
CPC ........................................................ H05K 7/00
See application file for complete search history.

(56) References Cited

U.S. PATENT DOCUMENTS

| | | | |
|---|---|---|---|
| 4,334,819 A | 6/1982 | Hammerslag | |
| 10,820,125 B2 | 10/2020 | Henriksen | |
| 2009/0058355 A1* | 3/2009 | Meyer | B60L 53/80 320/104 |
| 2018/0351300 A1* | 12/2018 | Zhu | G06F 21/32 |
| 2019/0355197 A1 | 11/2019 | Mirpuri | |
| 2022/0212638 A1 | 7/2022 | Georgeson et al. | |

OTHER PUBLICATIONS

PCT/US2024/051506—International Search Report, USPTO ISA/US, Jan. 15, 2025.
PCT/US2024/051506—Written Opinion of the International Searching Authority (ISA), USPTO ISA/US, Jan. 15, 2025.

* cited by examiner

*Primary Examiner* — Jerry Wu

(57) ABSTRACT

Systems and methods are disclosed that include an electronic device and an activation device. The electronic device includes a battery compartment having a battery storage section and a battery engagement section. The battery engagement section includes battery contacts. The electronic also includes a battery disposed in the battery storage section of the battery compartment. The battery moves from the battery storage section to the battery engagement section in response to an activation event to place the battery in electrical contact with the battery contacts. The activation device includes an activation element configured to generate the activation event.

14 Claims, 13 Drawing Sheets

SYSTEMS AND METHODS FOR ACTIVATING AN ELECTRONIC DEVICE VIA BATTERY DISPLACEMENT

BACKGROUND

Many electronic devices are powered by disposable and/or rechargeable batteries. Often when the battery is in electrical contact with the circuitry of the electronic device, whether the device is powered on or off or in a sleep mode, the circuitry can cause the battery to discharge over time.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1A:
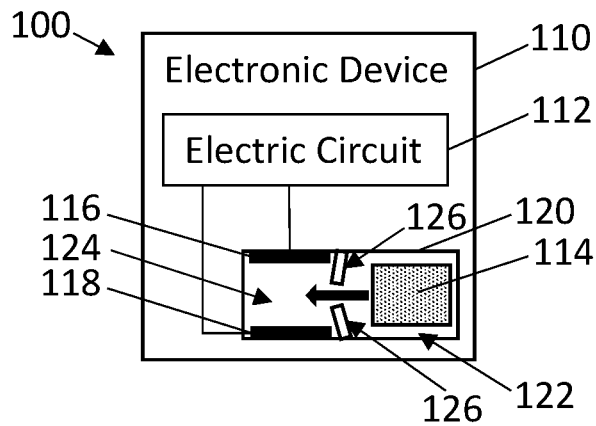
FIG. 1A is a block diagram of an electronic device in accordance with embodiments of the present disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The components of embodiments of the present disclosure have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

DETAILED DESCRIPTION

For electronic devices that are powered by batteries, it can be advantageous, practical, and in some cases necessary to include the battery in the electronic device at the time of manufacture. Typically, such electronic devices are not used immediately after manufacture and can remain idle for extended periods of time. If the battery is in electrical contact with the circuitry of the electronic device, the circuitry of the electronic device can cause the battery to discharge over time. Some electronic devices provide readily accessible battery compartments that allow for easy battery installation and removal such that when the electronic devices are being stored or not used for extended period of times, the electronic devices can be stored with the batteries removed. Other electronic devices can provide for pull tabs that are disposed between a terminal of the battery and a battery contact of the electronic devices, where the electronic devices can be stored (typically before their first use) with the pull tabs in place to aid in preventing/reducing discharging of the batteries over time. The pull tab can be pulled by the user to remove the pull tab and allow the battery terminal to contact the battery contact of the electronic devices such that the electronic devices can be powered on. The electronic devices that utilize pull tabs typically either have readily accessible battery compartments or openings in the housing through which the pull tabs can be removed by the user.

However, for some electronic devices, the battery compartment may not be readily accessible making the removal and installation of batteries or the removal of pull tabs impractical or impossible. Embodiments of the present disclosure provide for systems and methods for energizing electronic devices using a battery where the battery is moved from a battery storage position to a battery engagement position in response to an activation event without requiring access to the battery or the battery compartment.

In accordance with embodiments of the present disclosure, an electronic device is disclosed. The electronic device includes an electric circuit, a battery compartment, and a battery. The battery compartment includes a battery storage section and a battery engagement section. The battery engagement section includes battery contacts that are electrically connected to the electric circuit. The battery is disposed in the battery storage section of the battery compartment and moves from the battery storage section to the battery engagement section in response to an activation event to place the battery in electrical contact with the battery contacts.

In accordance with embodiments of the present disclosure, a system is disclosed. The system includes an electronic device and an activation device. The electronic device includes a battery compartment having a battery storage section and a battery engagement section. The battery engagement section includes battery contacts. The electronic device also includes a battery disposed in the battery storage section of the battery compartment. The battery moves from the battery storage section to the battery engagement section in response to an activation event to place the battery in electrical contact with the battery contacts. The activation device includes an activation element configured to generate the activation event.

In accordance with embodiments of the present disclosure, an activation device is disclosed. The activation device includes a housing having a first member defining a receiving area configured to receive an electronic device and a second member configured to support the first member. The first member is rotatably coupled to the second member. The activation also includes a magnet disposed in the second member. The magnet is configured to magnetically couple with a battery in the electronic device to move the battery into a position in which the battery is electrically connected to an electric circuit of the electronic device. The activation device also includes one or more communication interfaces disposed in the second member and a logic circuit disposed in the second member. The logic circuit is configured to control the communication interface to communicate with at least one of a near-field communication (NFC) module or a radiofrequency identification (RFID) module of the electronic device in response to receiving the electronic device by the receiving area.

In accordance with embodiments of the present disclosure, the battery compartment includes a retaining member disposed between the battery storage section and the battery engagement section. The retaining member inhibits movement of the battery from the battery storage section to the battery engagement section.

In accordance with any embodiments of the present disclosure, in response to the activation event, the battery exerts a force on the retaining member that displaces or deforms the retaining member so that the battery moves past the retaining member and into the battery engagement section in response to the activation event.

In accordance with embodiments of the present disclosure, the activation element is a magnet and the magnet induces a magnetic field encompassing the battery. The magnetic field moves the battery from the battery storage section to the battery engagement section in response to relative movement of the magnet to the battery compartment.

In accordance with embodiments of the present disclosure, the electronic device further includes a pusher element, a spring, and a latch assembly. The latch assembly has a locked position and an unlocked position. The activation event causes the latch assembly to move from the locked position to the unlocked position, and in response to the latch assembly being moved to the unlocked position, the spring member urges the pusher element against the battery to move the battery from the battery storage section to the battery engagement section. The activation event can be generated by the activation element.

In accordance with embodiments of the present disclosure, an interior volume of the battery compartment is inaccessible.

In accordance with embodiments of the present disclosure, the electronic device include a housing. The electric circuit and the battery compartment are disposed in the housing. The housing is sealed to prevent access to the interior volume of the battery compartment.

In accordance with embodiments of the present disclosure, the electric circuit of the electronic device is electrically coupled to the battery contacts and/or the electrical circuit includes a first communication module and a second communication module. The first communication module is operable when the battery is in the battery storage section and the second communication module is inoperable when the battery is in the battery storage section. The first communications module can be one of a near-field communication (NFC) circuit or a radiofrequency identification (RFID) circuit and the second communications module can be a Bluetooth circuit.

In accordance with embodiments of the present disclosure, the activation event corresponds to a movement of the electronic device.

In accordance with embodiments of the present disclosure, the activation device can include an output device. The one or more communication interfaces of the activation device can receive an identifier from the electronic device. The logic circuit of the activation device can transmit the identifier to a computing device and can receive a response authenticating the electronic device. The logic circuit of the activation device can output an indicator on the output device to indicate that the electronic device has been authenticated.

FIG. 1A is a block diagram of an electronic device 100 in accordance with embodiments of the present disclosure. The electronic device 100 can have a housing 110 and can include an electric circuit 112 configured to be powered by a battery 114 via battery contacts 116 and 118 that are electrically connected to the electric circuit 112. The battery 114 can be disposed in a battery channel or compartment 120 within the housing 110. The battery 114 is contained within the battery compartment 120, which can include a battery storage section 122 that offsets and electrically isolates the battery 114 from the battery contacts 116 and 118 and a battery engagement section 124 that facilitate electrical contact between the battery 114 and the battery contacts 116 and 118. The battery compartment 120 can define an interior volume surrounded by walls or other structural elements to define the sections 122 and 124 and contain the battery 114. In one example, the interior volume of the battery compartment is positioned, disposed, or otherwise formed such that the interior volume of the battery component 120 is inaccessible (e.g., the battery compartment 120 is devoid of a door in the housing or otherwise that facilitates access to the interior volume of the battery compartment 120. In one example, the housing 110 can be sealed to prevent access to the battery component and/or prevent fluids from entering the interior of the housing 110. In one example, the housing 110 can be formed from multiple housing members that are, for example, ultrasonically welded together. In one example, the housing 110 can include distinct housing components: one for the electric circuit 112 and one for the battery compartment 120.

The battery compartment 120 can further include one or more battery retaining members 126, which can be disposed in or protrude into the interior volume of the battery compartment 120. In one example, the battery retaining members can be formed of resilient and/or flexible material. The battery retaining members 126 can be configured and dimensioned to retain the battery 114 in the battery storage section 122 or the battery engagement section 124 unless and until a threshold force is applied to the retaining members 126, e.g., by the battery 114. In one example, the force profile can be asymmetrical such that a first threshold force can be required to move the battery 114 from the battery storage section 122 past the retaining members 126 to the battery engagement section 124 can be less than a second threshold force required to move the battery 114 from the battery engagement section 124 past the retaining members 126 to the battery storage section 122. Once the battery 114 is positioned in the battery engagement section 124, the second threshold force can effectively retain the battery 114 in the battery engagement section 124, e.g., for a life of the battery. For example, the retaining members 126 can be formed such that the second threshold force is greater than the force that can be exerted on the retaining members 126 by the battery 114.

The battery 114 can be positioned in the battery storage section 122 of the battery component 120 and the electronic device 100 can be stored for an extended period of time. For example, the battery 114 can be positioned in the battery storage section 122 at the time of manufacture and can remain in the battery storage section 122 until an activation event causes the battery 114 to move past the retaining members 126 and into the battery engagement section 124. This advantageously allows the electronic device 100 to be formed with the battery included in the electronic device 100 while isolating the battery from forming electrical contact with the battery contacts 124 and 126 until the electronic device will be used. By isolating the battery 114 in this manner, the charge of the battery will not be reduced or depleted through the electric circuit 112 over time. This may be particularly advantageous for embodiments in which the interior volume of the battery compartment 120 in inaccessible or not readily accessible such that the battery cannot simply be installed by user and/or placed in electrical contact with the battery contacts 116 and 118, e.g., because the battery compartment 120 and the housing 110 are sealed.

Figure 1B:
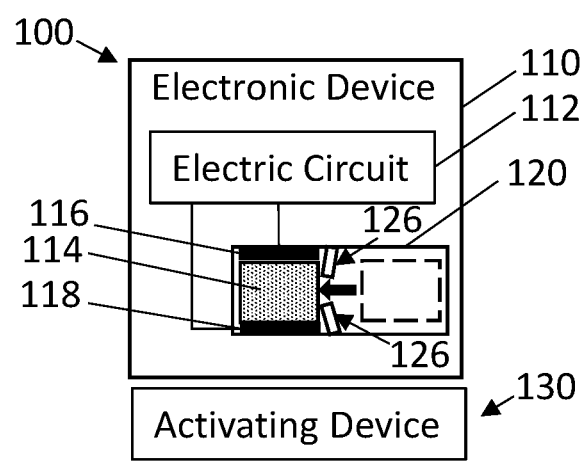
FIG. 1B is a block diagram of an electronic device and an activation device in accordance with embodiments of the present disclosure.

The activation event can cause the battery 114 to move from the battery storage section 122 to the battery engagement section 124. The activation event can cause the battery 114 to move within the battery compartment 120 without contacting or touching the battery 114 and without accessing the interior volume of the battery compartment 120. In one example, the activation event can be a gesture made by a user holding the electronic device 100, such as an abrupt movement of the electronic device (e.g., the user can shake the electronic device 100), which can cause the battery to move within the battery compartment 120 while generating a force against the retaining members 126 to allow the battery 114 to pass by the retaining member 126 and in to the battery engagement section 124. In one example, the activation event can be generated by an activation device 130 shown in FIG. 1B. As one example, when the activation device 130 is positioned in proximity of the electronic device 100 and/or moved relative to the electronic device 100, the activation device 130 can cause the battery 114 to move within the battery compartment 120 without contacting or touching the battery 114 and without accessing the interior volume of the battery compartment 120. As another example, the activation device 130 can cause a mechanism within the housing of the electronic device to urge the battery 114 from the battery storage section 122 past the retaining members 126 to the battery engagement section 124. The activation device 130 can cause the battery to move within the battery compartment 120 while generating a force against the retaining members 126 to allow the battery 114 to pass by the retaining members 126 and into the battery engagement section 124.

Figure 2A:
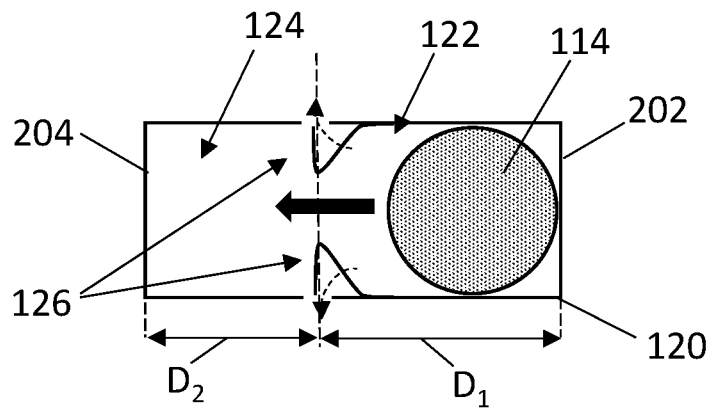
FIG. 2A-C are schematic views illustrating movement of a battery within a battery compartment in response to an activation event in accordance with embodiments of the present disclosure.
Figure 2B:
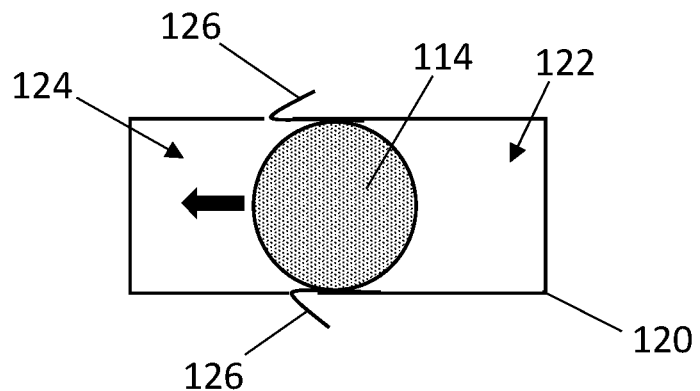
Figure 2C:
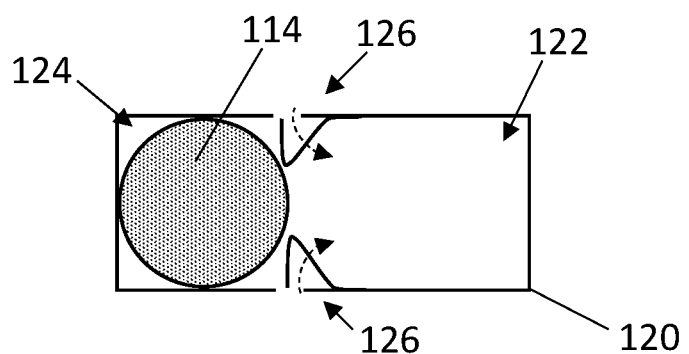

FIGS. 2A-C are schematic views of an embodiment of the battery compartment 120 of the electronic device illustrate movement of the battery 114 from the battery storage section 122 to the battery engagement section 124 of the battery compartment 120. As shown in FIG. 2A, the battery 114 can be positioned in the battery storage section 122 and the retaining members 126 can protrude into the battery compartment 120. For example, the retaining members 126 can be resilient detents biased to normally extend into the interior volume of the battery compartment 120 to prevent the battery 114 from moving to the battery engagement section 124 unless a threshold force is applied to the retaining members 126 by the battery. In one example, the retaining members 126 can be opposingly spaced from each other and/or can be electrically non-conductive. While two retaining members 126 have been illustrated, embodiments of the present disclosure can include fewer or more retaining members 126 (e.g., a single retaining member or three or more retaining members). During an activation event that imposes a force from the battery 114 onto the retaining members 126 greater that the threshold force, the resilient member 126 can be deflected outwardly from the interior volume of the battery compartment 120 (e.g., away from each other) as shown in FIG. 2B. Once the battery 114 passes the retaining members 126 and the battery 114 is in the battery engagement section 124, the retaining members 126 can return to their normal position extending into the battery compartment 120, as shown in FIG. 2C, to retain the battery 114 in the battery engagement section 124 in electrical contact with the battery contacts in the battery engagement section 124.

In one example, the resilient members 126 can extend asymmetrically into the battery compartment 120. For example, a first portion of the resilient members 126 can be a ramped or sloped section (e.g., extend between approximately 1 and 70 degrees relative to the wall from which the resilient members extend) to the facing the battery storage section 122 when the resilient members 126 are in their normal position (e.g., as shown in FIG. 2A) and a second portion of the resilient member facing the battery engagement section 124 that is generally perpendicular to the wall from which the resilient members 126 extend (e.g., extend between approximately 70 and 110 degrees relative to the wall from which the resilient members extend). The asymmetry of the retaining members 126 can allow the battery 114 to move past the retaining members 126 from the battery storage section 122 to the battery engagement section 124 and can prevent or inhibit the battery from moving past the resilient members 126 from the battery engagement section 124 to the battery storage section 122. In one example, the force profile can be asymmetrical such that a first threshold force required to move the battery 114 from the battery storage section 122 past the first portion of retaining members 126 to the battery engagement section 124 can be less than a second threshold force required to move the battery 114 from the battery engagement section 124 past the second portion retaining members 126 to the battery storage section 122 such that once the battery 114 is positioned in the battery engagement section 124, the second threshold force can effectively retain the battery 114 in the battery engagement section 124, e.g., for a life of the battery. For example, the retaining members 126 can be formed such that the second threshold force is greater than the force that can be exerted on the retaining members 126 by the battery 114.

In one example a distance $D_1$ between a terminal end 202 of the battery storage section 122 to the retaining members 126 (e.g., measure along a direction of travel of the battery 114) can be greater than or equal to a distance $D_2$ between a terminal end 204 of the battery engagement section 124 and the retaining members 126 (e.g., measure along a direction of travel of the battery 114). As an example, the distance $D_2$ can be specified to correspond to one or more dimensions of the battery 114 such that the battery 114 fits between the terminal end 204 and the retaining members 126 with little or no room to move within the battery engagement section 124. In one example, when the is positioned in the battery engagement section 124, the battery 114 can be in contact with the terminal end 204 and the retaining members 126. In one example, the distance $D_1$ can be specified such that the battery 114 does not move within the battery storage section 122 until the activation event causes the battery 114 to move (e.g., the distance $D_1$ can be equal to the distance $D_2$). In one example, the distance $D_1$ can be specified such that the battery 114 can move within the battery storage section 122 (e.g., the distance $D_1$ can be greater than the distance $D_2$), e.g., to allow the battery 114 to gain momentum before engaging the retaining members 126.

Figure 3A:
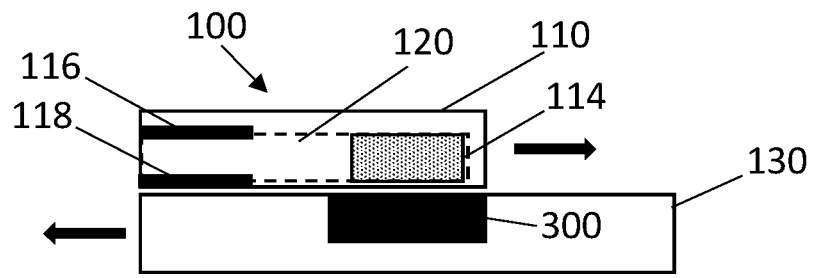
FIGS. 3A-B is schematic view of an example interaction between an embodiment of the electronic device and an embodiment of the activation device in accordance with embodiments of the present disclosure.
Figure 3B:
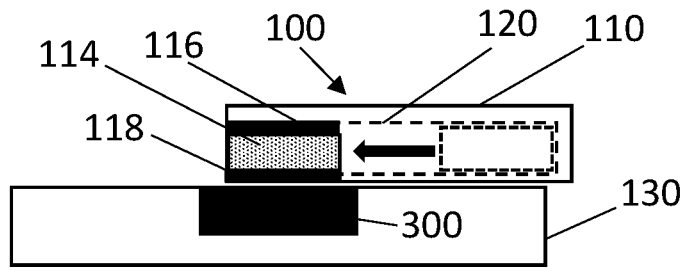
Figure 4:
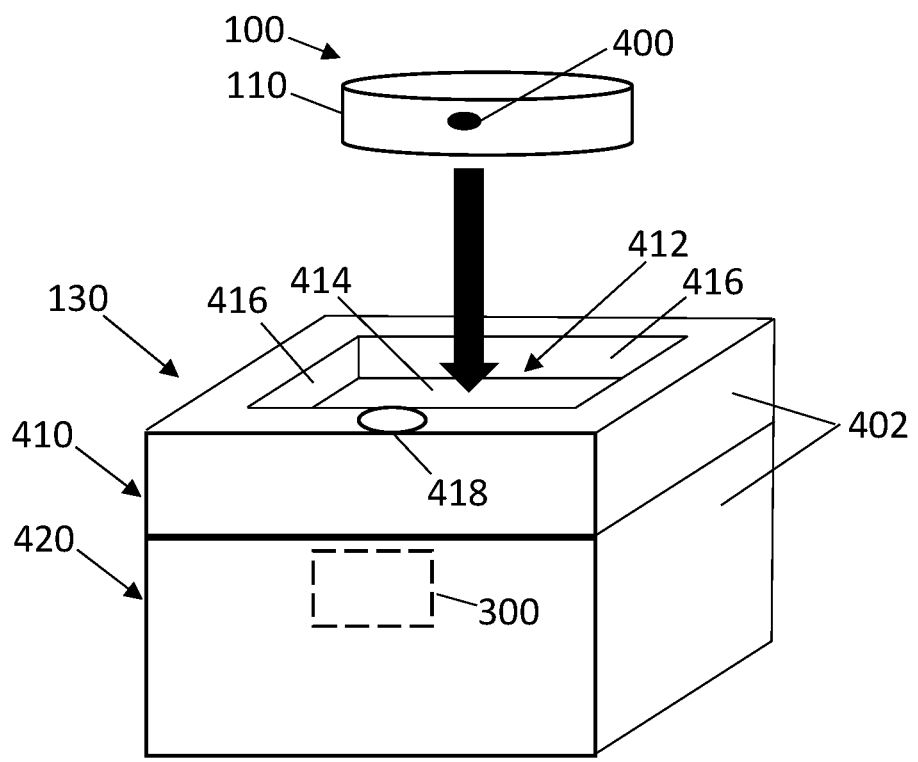
FIG. 4 illustrates an example of an embodiment of the electronic device and an example of an embodiment of the activation device in accordance with embodiments of the present disclosure.

FIG. 3A-B are schematic views of an example interaction between an embodiment of the electronic device 100 and an embodiment of the activation device 130 in accordance with embodiments of the present disclosure. As shown in FIG. 3A, the activation device 130 can include an activation element in the form of a magnet 300. The activation device 130 can be positioned proximate to the housing 110 of the electronic device 100 and the magnet 300 can be aligned with the battery 114. As an example, the battery compartment 120 can be disposed near a wall of the housing 110 such that the magnetic field of the magnet attracts the battery 114 and magnetically couples the magnet 300 and the battery through the housing 110. Once the magnet 300 and the and the battery 114 are aligned and/or magnetically coupled, at least a portion of the activation device 130 can be moved relative to the housing 110 of the electronic device 100 and/or at least a portion of the housing 110 of the electronic device can be moved relative to activation device 130. As shown in FIG. 3B, the activation device 130 and/or the electronic device are moved relative to each other, the battery 114 can be moved within the battery compartment 120 based on the magnetic coupling as the relative position of the magnet 300 is moved to align with the battery engagement section 124 and the battery 114 can be positioned in the battery engagement section 124 (e.g., after passing the retaining members 126). The strength of the magnetic field generated by the magnet 300 can prevent the battery 114 from magnetically decoupling from the magnet 300 as the battery 114 is urged towards the battery engagement section overcoming the threshold force of the retaining members 126. The magnet 300 can be a permanent magnetic, temporary magnet, or an electromagnetic.

FIGS. 4 and 5A-C illustrate an example embodiment of the activation device 130 in accordance with embodiments of the present disclosure. The activation device 130 can include a housing 402 having a first member 410 rotatable coupled to a second member 420. The first member 410 can include a receiving area 412 configured to receive and support an embodiment of the electronic device 100. As one example, the receiving area 412 can be recessed within the first member 410 to define a tray having a support surface 414 upon which the electronic device 100 can rest and interior walls 416 to retain the electronic device 100 in the receiving area 412. The electronic device 100 can include an indicator device 400 and/or other markers or indicia on the housing 110 of the electronic device 100 to facilitate alignment of the electronic device 100 in the receiving area 412. For embodiments of the electronic device 100 that include the indicator device 400, the indicator device 400 can be used to output a status of the electronic device 100. The first member 410 can also include an indicator 418 that can provide an output indicating whether the communication has been established between the electronic device 100 and the activation device 130, whether the electronic device 100 was successfully activated (e.g., whether the battery 114 within the electronic device has been positioned in the battery engagement section and the electronic circuit is energized), whether the electronic device 100 failed to be activated (e.g., whether the battery 114 within the electronic device has not been positioned in the battery engagement section or the battery cannot energize the electric circuit). The second member 420 can include the magnet 300. The electronic device 100 can be positioned in the receiving area 412 according to a specified orientation and while the first member 410 is supporting the electronic device 100, the first member can be rotated relative to the second member 420, the second member 420 can be rotated relative to the first member 410, or the first and second members 410 and 420 can be rotated relative to each other to activate the electronic device 100 by moving the battery 114 within the electronic device 100 from the battery storage section 122 to the battery engagement section 124.

Figure 5A:
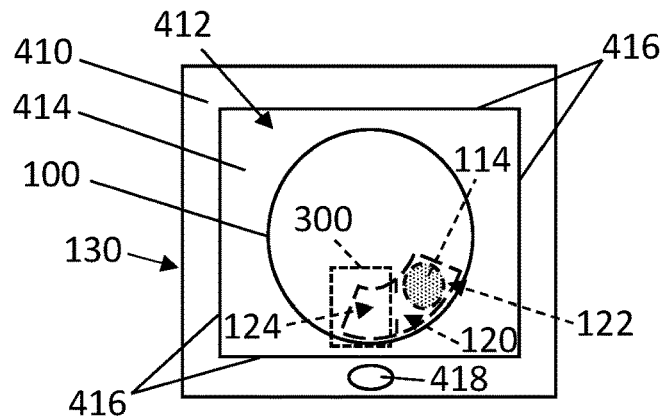
FIGS. 5A-C illustrate displacing a battery within the housing of an embodiment of the electronic device using an embodiment of the activation device in accordance with embodiments of the present disclosure.
Figure 5B:
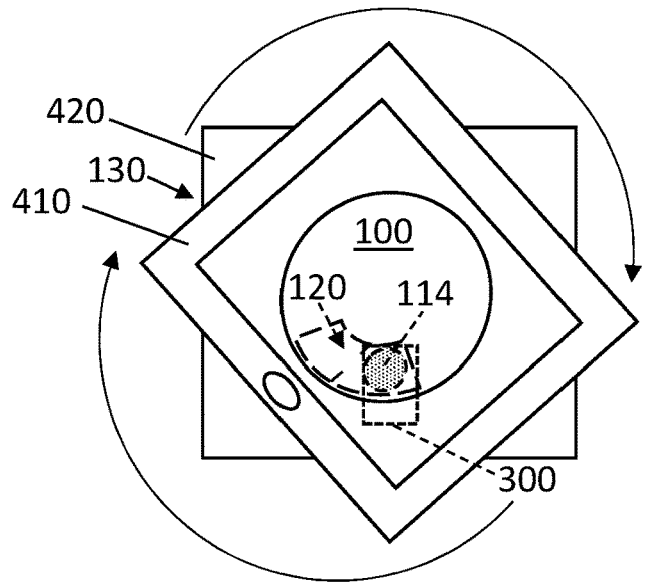
Figure 5C:
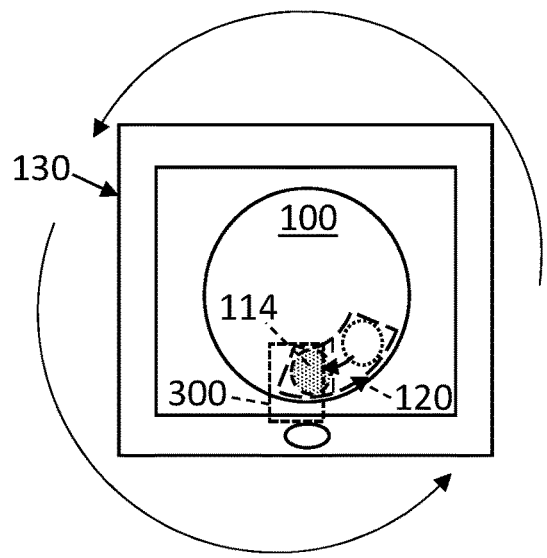

As shown in FIGS. 5A-C, the battery 114 can be displaced within the housing 110 of the electronic device 100 via the activation device 130 using one or more sequences of movement. In one example, as shown in FIG. 5A, the electronic device 100 can be oriented on the support surface 414 of the receiving area 412 in the first member 410 such that the battery engagement area 124 of the battery compartment 120 in the electronic device 100 is aligned with the magnet 300 in the second member 420, while the battery 114 is positioned in the battery storage section 122. As shown in FIG. 5B, the first member 410 with the electronic device 100 can be rotated relative to the second member 420 in a first direction (e.g., in a clockwise direction in the orientation shown in FIGS. 5A-C) to align the magnet 300 in the second member 420 with the battery 114 in the battery storage section 122 of the battery compartment 120 to magnetically couple to the battery 114 to the magnet 300. Subsequently, the first member 410 with the electronic device 100 can be rotated relative to the second member 420 in a second direction (e.g., in a counterclockwise direction in the orientation shown in FIGS. 5A-C) to cause the battery 114 to move in the battery compartment 120 from the battery storage section 122 past the retaining members (retaining members 126) to the battery engagement section 124 due to the magnetic coupling between the magnet 300 and the battery 114. After the first member is rotated in the second direction the indicator(s) 400 and/or 418 can provide one or more indications regarding an operation of the electronic device 100 (e.g., whether the battery 114 has been moved to the battery engagement area 124, whether the electronic device is energized, etc.).

The first member 410 can be rotated a specified number of degrees in the first direction and specified number of degrees in the second direction. For example, the first member 410 can be rotated approximately 30 to 290 degrees in the first direction and can be rotated approximately 30 to 290 degrees in the second direction. In one example, the first member 410 can be rotated 45 degrees in the first direction and 45 degrees in the second direction. In the present example, the second member 420 and the magnet 300 remains stationary while the first member 410 with the electronic device rotate relative to the magnet 300. In other examples, the first member 410 and the electronic device 100 can remain stationary while the second member 420 and the magnet rotate relative to the first member 410 and the electronic device 100. In yet other examples, the magnet 300 itself can move within the second member 420 and the first member 410, the second member 420, and the electronic device 100 can remain stationary.

Figure 6:
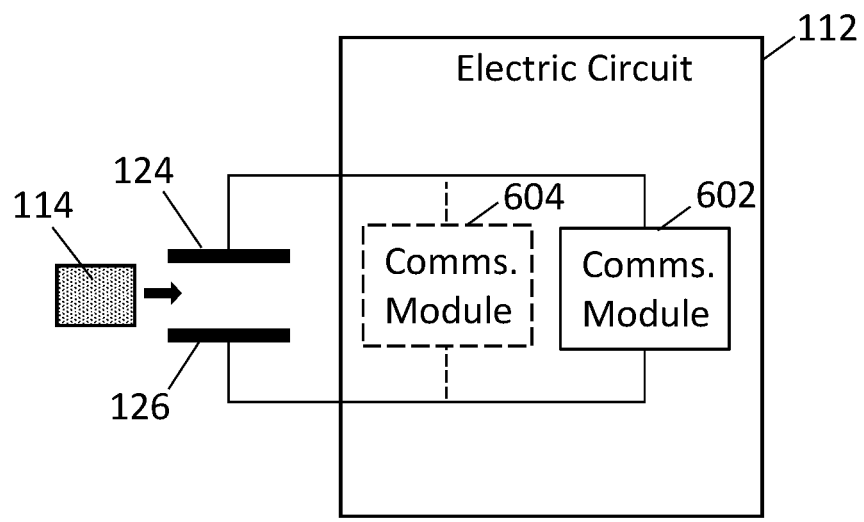
FIG. 6 is a block diagram of an example electric circuit of an embodiment of the electronic device shown in FIGS. 1A-B in accordance with embodiments of the present disclosure.
Figure 7:
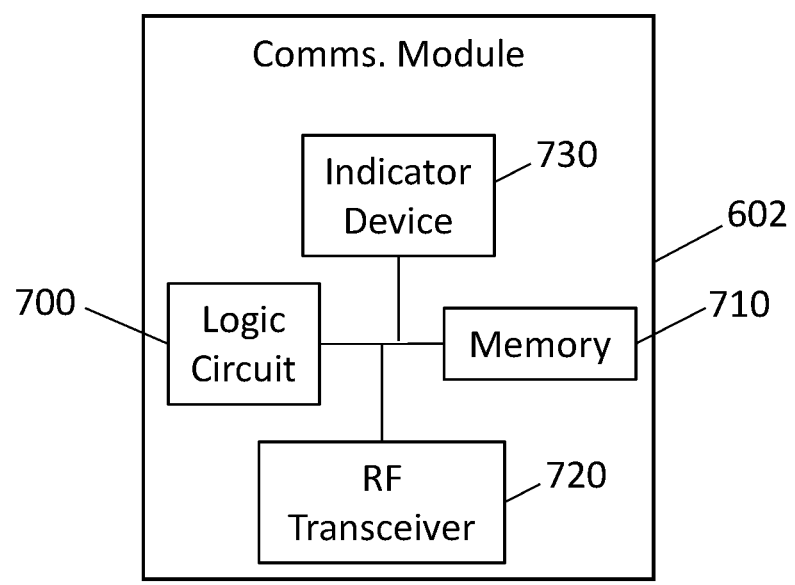
FIG. 7 is a block diagram of an example communications module of an embodiment of the electric circuit shown in FIG. 6 in accordance with embodiments of the present disclosure.
Figure 8:
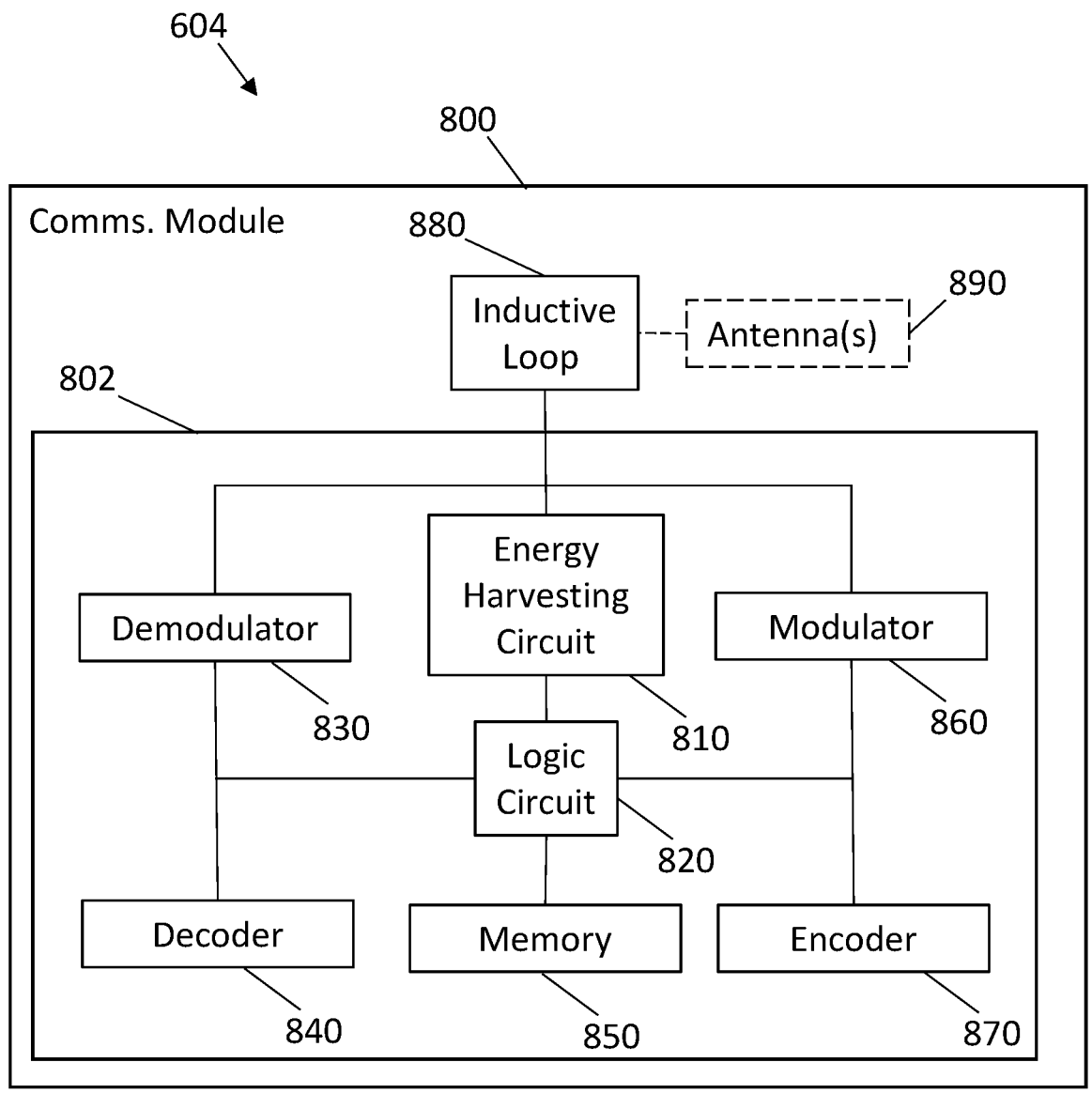
FIG. 8 is a block diagram of another example communications module of an embodiment of the electric circuit shown in FIG. 6 in accordance with embodiments of the present disclosure.

FIG. 6 is a block diagram of one example of the electric circuit 112 of an embodiment of the electronic device 100 in accordance with embodiments of the present disclosure. The electric circuit 112 can be electrically coupled to the battery contacts 124 and 126 and can include a communications module 602 and a communications module 604. The communications module 602 can receive power from the battery 114 when the battery 114 is in electrical contact with the battery contacts 124 and 126. In one example, the communications module 604 is not electrically connected to the battery contacts 124 and 126 and does not receive power from the battery 114. The communications module 604 can be independently powered and/or operated without the battery 114. In another example, the communications module 604 can also form part of the electric circuit 112 and can receive power from the battery 114 when the battery 114 is in electrical contact with the battery contacts 124 and 126. One example of the communications module 602 which is powered by the battery 114 is illustrated in FIG. 7. In some examples, the communication module 604 implemented in the same manner as the communication module 602. One example of an embodiment of the communications module 604 which is powered independently from the battery 114 is illustrated in FIG. 8.

For embodiments in which the communications modules 602 and 604 are powered by the battery 114, the communication modules 602 and 604 are not operational until the battery 114 is moved to be in contact with the battery contacts 124 and 126. For embodiments in which the communications module is powered independently from the battery 114, the communications module 604 may be operational while the communications module 602 is not operational based on a position of the battery 114 (e.g., because the battery 114 is in the battery storage section 122). In one example, the communication modules 602 and 604 can be wireless communication modules configured to transmit and receive radiofrequency signals. The communication modules can be configured to operate in different frequency bands, different channels, and/or different communication protocols. As a nonlimiting example, the communications module 602 can be configured to operate in a 2.4 GHz frequency band and the communication device 604 can be configured to operate in a lower frequency band(s), such as, e.g., 125-150 kHz, 13-14 MHZ, and/or 865-928 MHz. The communication module 602 can be a Bluetooth® communication module and the communication module 604 can be a near-field communication (NFC) module and/or a near-field or far-field radiofrequency identification (RFID) module.

FIG. 7 is a block diagram of one example of the communications module 602 of an embodiment of the electric circuit 112 shown in FIG. 6 in accordance with embodiments of the present disclosure. In some examples, the communication device 604 can also be implemented in the same manner as shown in FIG. 7 for the communications module 602. The communication module 602 can include a logic circuit 700, memory 710, a radiofrequency (RF) transceiver 720, an antenna 730, and/or the indicator device 400. As a non-limiting example, the communication module 602 can be implemented as one or more integrated and/or discrete circuits.

The RF transceiver 720 can be configured to transmit (e.g., via a transmitter of the RF transceiver) and/or receive (e.g., via a receiver of the RF transceiver) wireless transmissions via an antenna 722. For example, the RF transceiver 720 can be configured to transmit one or more messages, directly or indirectly, to one or more other devices (e.g., the activation device 130, computing device, server, other network devices, Bluetooth® locator/receivers, etc.) and/or to receive one or more messages, directly or indirectly, from one or more other devices (e.g., the activation device 130, computing device, server, other network devices, Bluetooth® locator/receivers, etc.). The RF transceiver 720 can be configured to transmit and/or receive messages at a specified frequency and/or according to a specified sequence and/or packet arrangement. As one example, the RF transceiver 720 can be a Bluetooth® transceiver configured to conform to a Bluetooth® wireless standard for transmitting and/or receiving short-wavelength radio transmissions typically in the frequency range of approximately 2.4 gigahertz (GHz) to approximately 2.48 GHz. As another example, the RF transceiver 720 can be a Wi-Fi transceiver (e.g., as defined IEEE 802.11 standards), which may operate in an identical or similar frequency range as Bluetooth®, but with higher power transmissions. Some other types of RF transceivers 406 that can be implemented by the sensor module circuitry includes RF transceivers configured to transmit and/or receive transmissions according to the Zigbee® or Z-Wave communication protocol and/or any other suitable communication protocol.

The indicator device 400 can output an indicator corresponding to, e.g., a status of the electronic device (e.g., energized/activated), the battery (charged, low battery, etc.), and/or the communication modules 602 and/or 604 (transmitting, receiving, operating, etc.). The indicator device 400 can be a visual indicator (such as a light, an audio indicator such as a speaker, and/or a tactile indicator sensor such as a piezoelectric device that vibrates). For convenience, the indicator device 400 has been illustrated as being part of the communications module 602. However, the indicator device 40 can simply form part of the electric circuit 112 and can be operatively coupled to communications module 602 and/or the communications module 604. In some examples, the electric circuit 112 and the communication modules 602 and/604 can be devoid of the indicator device 400.

The logic circuit 700 can include, for example, one or more logic gates, a processor, and/or any suitable types of logic circuits. Additional and/or alternative example logic circuits, such as field programmable gate arrays (FPGAs) and application specific integrated circuits (ASICs) capable of, for example, implementing operations of the activation device 130. The logic circuit 700 can be programmed and/or configured to control an operation of the communications module 602 and/or electronic device 100, e.g., in response to execution of instructions or code stored in the memory 710.

The communication module 602 includes any number or types of non-transitory computer- or machine-readable storage devices or memory 710 (e.g., volatile memory, non-volatile memory, etc.) accessible by the logic circuit 700. The logic circuit 700 interacts with the memory 710 to obtain, for example, computer- or machine-readable instructions or code stored in the memory 710. The memory 710 can also store, e.g., a device identifier that can be included in a beacon signal output by the communications module 602 to identify the electronic device 100 as the device from which the beacon signal is transmitted.

The logic circuit 700 can execute the computer- or machine-readable instructions or code stored in the memory 710 to implement, for example, embodiments of the present disclosure via one or more operations, processes, routines, and/or functions. As an example, the logic circuit 700 can execute the instructions or code stored in memory 710 to control an operation of the indicator device 400 to output an indicator via the indicator device 400 and/or an operation of the transceiver to generate and transmit beacon signals.

FIG. 8 is a block diagram of one example of the communications module 604 of an embodiment of the electric circuit 112 shown in FIG. 6 in accordance with embodiments of the present disclosure. As shown in FIG. 8, the communication module 604 can be implemented as an NFC/RFID circuit 800 that includes an energy harvesting circuit 810, a logic circuit 820, a demodulator 830, a decoder 840, memory 850, a modulator 860, an encoder 870, and inductive loop 880. The NFC/RFID circuit 800 can also include one or more antennas 890. In some examples, the circuit 800 can include the antennas 890 for far-field RFID applications and can be devoid of the antennas 890 for NFC applications. As a non-limiting example, the communication module 604 can be implemented as one or more integrated and/or discrete circuits.

The memory 850 is a non-transitory computer-readable medium that can include volatile (e.g., RAM) and/or non-volatile memory (e.g., EEPROM). The memory 850 can store data, including an identifier, which can be used to identify and distinguish the NFC/RFID circuit 800 from other NFC/RFID circuits in a system and can also be used to authenticate the electronic device. In an example embodiment, the identifier can be a string of numeric or alphanumeric characters.

When the NFC/RFID circuit 800 is within a read range of an NFC/RFID reader/interrogator, radio waves of the far-field radiofrequency communication emitted by the NFC/RFID reader can generate a time varying electromagnetic field, which in turn can induce, via inductive coupling, an electrical signal (e.g., an electric current) in the antenna(s) 890 and/or the inductive loop 880. The electrical signal can be processed by the energy harvesting circuit 810 to generate a power supply voltage to power the components of the communication module 604. For example, the energy harvesting circuit 810 receives the electrical signal from the inductive loop 880 and converts the electrical signal to a direct current voltage. The energy harvesting circuit 810 can include, for example, a charge pump, voltage converter, voltage regulator, and/or other circuitry. The electrical signal can also include information that can be demodulated by the demodulator 830 and decoded by the decoder 840. The decoded electrical signal can be received as an input by the logic circuit 820 from the decoder 840.

In response to receipt of the decoded electrical signal and when sufficient power is generated from the induced electrical current, the logic circuit 820 can retrieve data from the memory 850 (e.g., the identifier) and output the data to the encoder 870. The logic circuit 820 can include software, firmware, and/or hardware, or any combination thereof to facilitate the operations performed by the logic circuit 820. For example, the logic circuit 820 can include digital circuitry, such as logic gates, and can include a processor. The encoder 870 can encode the data from the logic circuit 820 and output the encoded data to the modulator 860, which can modulate the encoded data and output the modulated data to the inductive loop 880, which can modulate the modulated signal onto the radiofrequency communication received by the NFC/RFID circuit 800 from the NFC/RFID reader. For embodiments that include the antennas 890, the output can be modulated onto the radiofrequency communication by the inductive loop 880 in combination with the antennas 890.

While an example embodiment of the NFC/RFID circuit 800 has been illustrated in FIG. 8, embodiments of the NFC/RFID circuit 800 can include more, fewer, and/or different components. As an example, the NFC/RFID circuit 800 can include any number of energy harvesting circuits, demodulators, decoders, logic circuits, encoders, and/or modulators.

Figure 9:
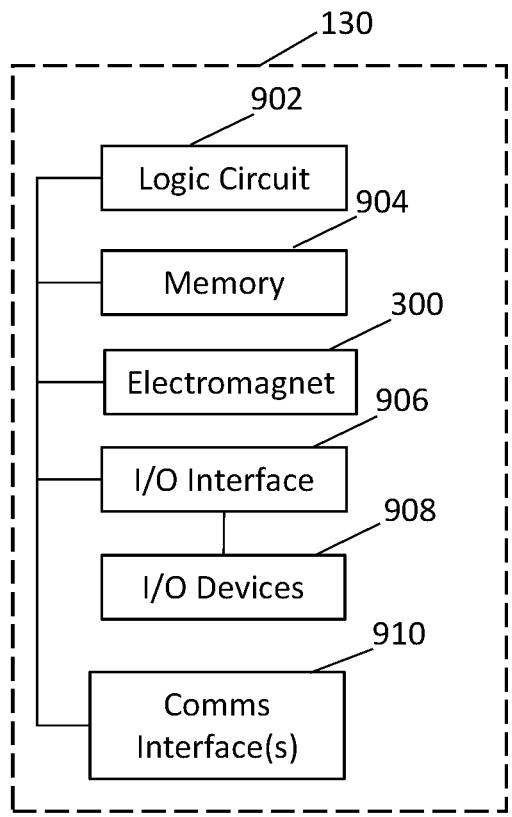
FIG. 9 is a block diagram illustrating an electronic circuit of an embodiment of the activation device in accordance with embodiments of the present disclosure.

FIG. 9 is a block diagram illustrating an electronic circuit of an embodiment of the activation device 130 in accordance with embodiments of the present disclosure. The activation device 130 can include a logic circuit 902, memory 904, Input/Output (I/O) interface 906, and/or a communication interface 910. The activation device 130 can be powered by a power source, which may or may not be included in the activation device 130. For example, in some embodiments, the power source can be an external power source, such power from power outlet, and/or an internal power source, such as a battery.

The I/O interface 906 can include any number and/or type(s) of different types of I/O circuits, components, and/or interfaces to enable receipt of user input from I/O devices 908, communicate output data via the I/O devices 908, and/or communicate with other devices (e.g., a server, a computing device, etc.). The I/O devices 908 can include a display, a navigation device 166 (e.g., a mouse, a trackball, a capacitive touch pad, a joystick, etc.), buttons, switches, indicator lights, keypads/keyboard, a microphone, speakers, and/or other devices. The I/O interface 906 can receive input from a user or another device and/or can output information or data to a user or another device. As an example, a user or other device can actuate, manipulate, and/or control the display, the navigation device, buttons, switches, sensors, indicator lights, keypads/keyboard, microphone, and/or speakers and the logic circuit 902 can execute one or more instructions or code in response to the input. As another example, the display, indicator lights, and/or speakers can be actuated or controlled by the logic circuit 902 to output data or information in response to operations performed by the logic device 902, e.g., based on execution of the computer- or machine-readable instructions and/or the input from the user or another device. The I/O interface 130 can be integrated with the logic circuit 902.

The logic circuit 902 can include, for example, one or more logic gates, a processor, and/or any suitable types of logic circuits. Additional and/or alternative example logic circuits, such as field programmable gate arrays (FPGAs) and application specific integrated circuits (ASICs) capable of, for example, implementing operations of the activation device 130. The logic circuit 902 can be programmed and/or configured to control an operation of the activation device 130, e.g., in response to execution of instructions or code stored in the memory 904.

The activation device 130 includes any number or types of non-transitory computer- or machine-readable storage devices or memory 904 (e.g., volatile memory, non-volatile memory, etc.) accessible by the logic circuit 902. The logic circuit 902 interacts with the memory 904 to obtain, for example, computer- or machine-readable instructions or code stored in the memory 904. Additionally or alternatively, computer- or machine-readable instructions corresponding to the example operations described herein may be stored on one or more removable media (e.g., a magnetic storage drive, an optical storage drive, solid state drive, a compact disc (CD), a digital versatile disk (DVD), a removable flash memory, etc.) that may be operatively coupled to the logic circuit 902 to provide access to the computer- or machine-readable instructions stored thereon. The memory 904 can also store, e.g., identifiers of NFC/RFID identifiers that can be used by the activation device to authentic electronic devices.

The logic circuit 902 can execute the computer- or machine-readable instructions or code stored in the memory 904 to implement, for example, embodiments of the present disclosure via one or more operations, processes, routines, and/or functions. As an example, the logic circuit 902 can execute the instructions or code stored in memory 904 to control an operation of the magnet 300 (e.g., for embodiments in which the magnet is a temporary magnet or an electromagnet) and the I/O devices 908 via the I/O interface(s) 906.

The activation device 130 can also include any number and/or type(s) wired and/or wireless communication or network interface(s) 910 that communicatively couple the logic circuit 902 to one or more other devices, such as any one or more of the I/O devices 908, the electronic device 100, a server, a computing device, a network device (e.g., access point, router, hub, switch), a cellular base station, etc. The communication interface(s) 910 can facilitate direct communication with the other devices and/or can facilitate indirect communication with the other devices via a network. The communication interface(s) 910 can operate in accordance with any suitable interface(s), protocol(s), signal(s), connector(s), etc. like, for example, a TCP/IP interface, a Wi-Fi™ interface (according to the IEEE 802.11 family of standards), Zigbee® interface, Z-Wave interface, cellular interface (e.g., using GSM, GPRS, CDMA, GPRS, 2G/GSM, 3G, 4G/LTE, EDGE, 5G), a Ethernet transceiver, a universal serial bus (USB) interface, a Bluetooth® interface, a near field communication (NFC) interface, radiofrequency identifier (RFID) interface, an infrared transceiver, a satellite network radio, a cable modem, a digital subscriber line (DSL) modem, a dialup modem, and/or any other suitable communication protocols or standards.

Figure 10:
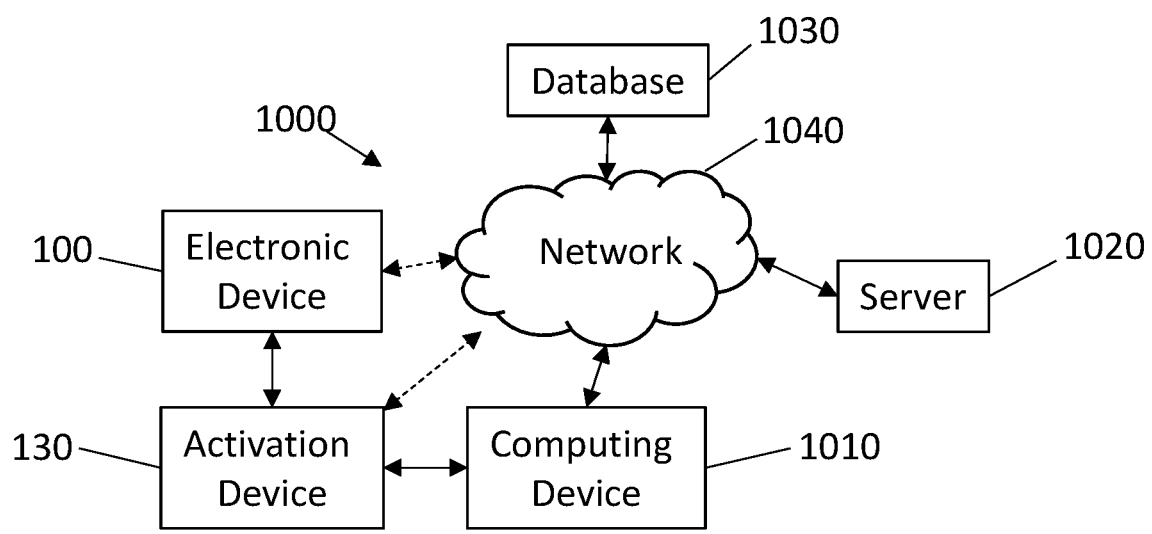
FIG. 10 illustrates an example environment for authentication and/or activation of the electronic device in accordance with embodiments of the present disclosure.

FIG. 10 illustrates an example environment 1000 for authentication and/or activation of an embodiment of the electronic device 100 in accordance with embodiments of the present disclosure. As shown in FIG. 10, the environment 1000 can include embodiments of the electronic device 100 and the activation device 130 as well as a computing device 1010, a server 102, and/or a database 1030, which can be operatively coupled to each other through a communication network 1040. The server 1020 can be computing device including a processor for executing instructions in accordance with embodiments of the present disclosure. The communication network 1040 can be implemented as the Internet, an Intranet, virtual private network (VPN), wide area network (WAN), local area network (LAN), a cellular network, a mesh or ad-hoc network, and/or other suitable communication network. The electronic device 100, the activation device 130, and/or the computing device 1010 can communicate with the server 1020 and database 1030 via the communication network 1040.

The electronic device 100, the activation device 130, and/or the computing device 1010 can communicate with the server 1020 and the server 1020 can perform one or more operations in response to the received communication. The server 1020 can execute computer- or machine-readable instructions or code to perform operations and processes described herein. As an example, messages can be transmitted from the electronic device 100, the activation device 130, and/or the computing device 1010 to the server 1020, and the processor of the server 1020 can perform one or more operations based on the messages (such as authentication of the electronic device 100, location tracking of the electronic device 100). The server 1020 can transmit a response to the electronic device 100, the activation device 130, and/or the computing device 1010, which can output information or data associated with the response from the server 1020 via one or more I/O devices (e.g., authentication is success or failed). The server 1020 can implement enterprise service software that can include, for example, RESTful (representational state transfer) API services, message queuing service, and event services that may be provided by various platforms or specifications, such as the J2EE specification implemented by any one of the Oracle WebLogic Server platform, the JBoss platform, or the IBM WebSphere platform, etc. Other technologies or platforms, such as Ruby on Rails, Microsoft.NET, or similar may also be used.

The network environment 1000 can be implemented, for example, in a location tracking system. The electronic device 100 can be authenticated and activated as described herein. As an example, the electronic device 100 can be authenticated by the activation device 130, the computing device 1010, and/or the server 1020 by comparing an identifier received from the electronic device to stored identifiers, e.g., stored in the database 1030 and the electronic device 100 can emit beacon messages which can be received by locators/receivers of the network 1040 and used by the computing device 1010 and/or the server 1020 to track a location of the electronic device, e.g., through a facility.

Figure 11:
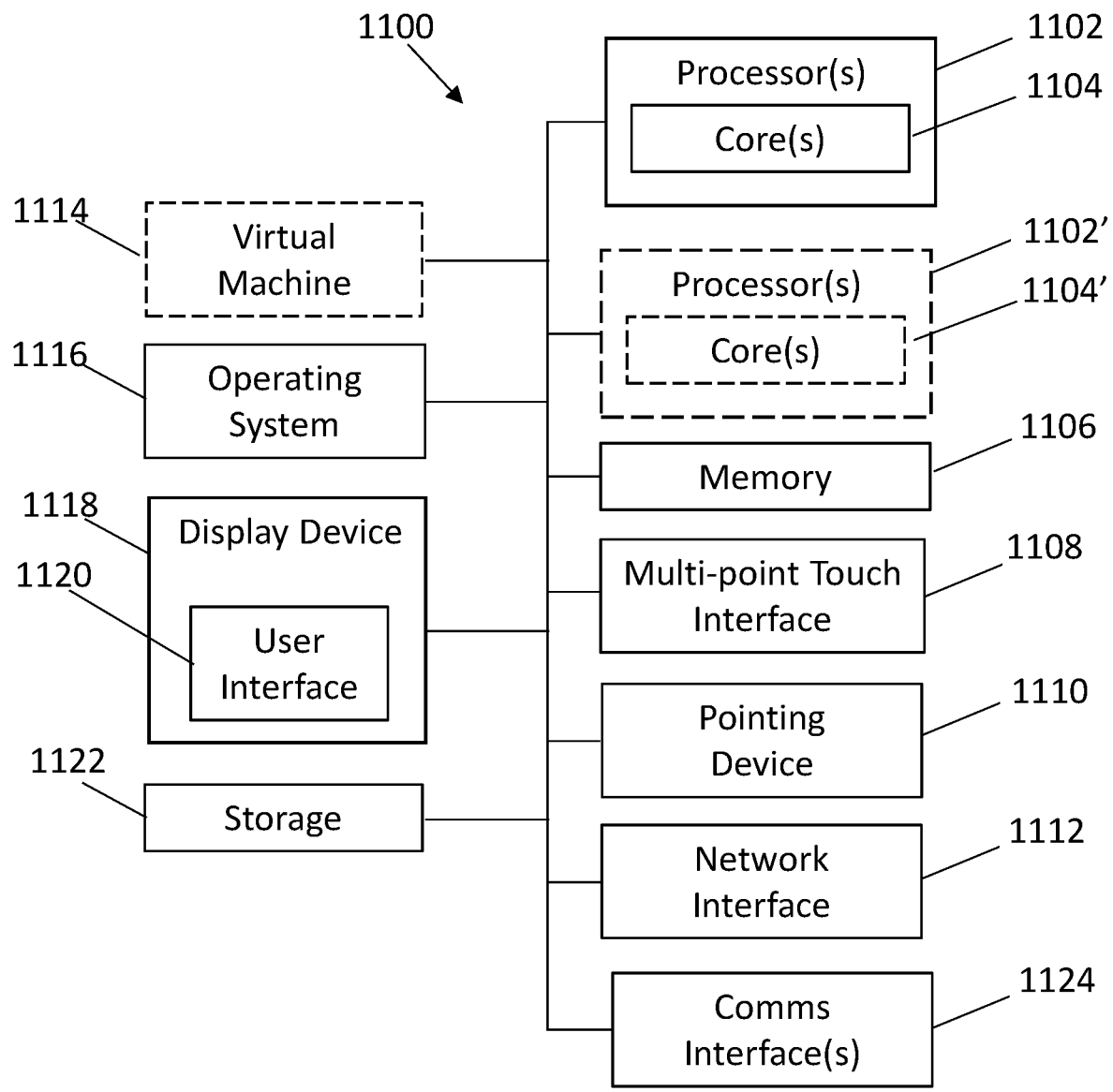
FIG. 11 is a block diagram of an example computing device in accordance with embodiments of the present disclosure.

FIG. 11 is a block diagram of an example computing device 1100 in accordance with embodiments of the present disclosure. The computing device 1100 includes one or more non-transitory computer-readable media for storing one or more computer-executable instructions or software for implementing exemplary embodiments. The non-transitory computer-readable media may include, but are not limited to, one or more types of hardware memory, non-transitory tangible media (for example, one or more magnetic storage disks, one or more optical disks, one or more flash drives), and the like. For example, memory 1106 included in the computing device 1100 may store computer-readable and computer-executable instructions or software for implementing exemplary embodiments of described herein. The computing device 1100 also includes configurable and/or programmable processor 1102 and associated core 1104, and optionally, one or more additional configurable and/or programmable processor(s) 1102' and associated core(s) 1104' (for example, in the case of computer systems having multiple processors/cores), for executing computer-readable and computer-executable instructions or software stored in the memory 1106 and other programs for controlling system hardware. Processor 1102 and processor(s) 1102' may each be a single core processor or multiple core (1104 and 1104') processor.

Memory 1106 may include a computer system memory or random-access memory, such as DRAM, SRAM, EDO RAM, and the like. Memory 1106 may include other types of memory as well, or combinations thereof.

A user may interact with the computing device 1100 through a visual display device 1118, such as a computer monitor, which may display one or more user interfaces 1120 that may be provided in accordance with exemplary embodiments. The computing device 1100 may include other I/O devices for receiving input from a user, for example, a keyboard or any suitable multi-point touch interface (e.g., keyboard) 1108, a pointing device 1110 (e.g., a mouse). The keyboard 1108 and the pointing device 1110 may be coupled to the visual display device 1118. The computing device 1100 may exclude I/O peripherals or may include other suitable conventional I/O peripherals.

The computing device 1100 may also include one or more storage devices 1124, such as a hard-drive, CD-ROM, or other computer readable media, for storing data and computer-readable instructions and/or software that implement exemplary embodiments of described herein. Exemplary storage device 1124 may also store information used to implement example embodiments, such as information and/or data. As an example, the storage device 1124 can store the identifier of the electronic device 100; identifiers of other electronic devices; associations between the objects, animals, humans (e.g., patients), etc., and the identifiers; locations of the electronic devices; a battery life remaining or status of the electronic devices; and/or other information/data. Additionally or in the alternative, the computing device 1100 can also communicate with or alternative include a database (e.g., database 1040 shown in FIG. 10) that stores information, such as the identifier of the electronic device 100; identifiers of other electronic devices; associations between the objects, animals, humans (e.g., patients), etc., and the identifiers; locations of the electronic devices; a battery life remaining or status of the electronic devices; and/or other information/data.

The computing device 1100 can include a network interface 1112 configured to interface via one or more network devices 1122 with one or more networks (e.g., network 520), such as the Internet, an Intranet, virtual private network (VPN), wide area network (WAN), local area network (LAN), a cellular network, a mesh or ad-hoc network, and/or other suitable communication network, or some combination of any or all of the above. The network interface 1112 may include a built-in network adapter, network interface card, PCMCIA network card, card bus network adapter, wireless network adapter, USB network adapter, modem or any other device suitable for interfacing the computing device 1100 to any type of network capable of communication and performing the operations described herein. Moreover, the computing device 1100 may be any computer system, such as a workstation, desktop computer, server, laptop, handheld computer, tablet computer (e.g., the iPad™ tablet computer), mobile computing or communication device (e.g., the iPhone™ communication device), or other form of computing or telecommunications device that is capable of communication and that has sufficient processor power and memory capacity to perform the operations described herein.

The computing device 1100 may run any operating system 1116, such as any of the versions of the Microsoft® Windows® operating systems, the different releases of the Unix and Linux operating systems, any version of the MacOS® for Macintosh computers, any embedded operating system, any real-time operating system, any open source operating system, any proprietary operating system, or any other operating system capable of running on the computing device and performing the operations described herein. In exemplary embodiments, the operating system 1116 may be run in native mode or emulated mode. In an exemplary embodiment, the operating system 1116 may be run on one or more cloud machine instances.

Figure 12:
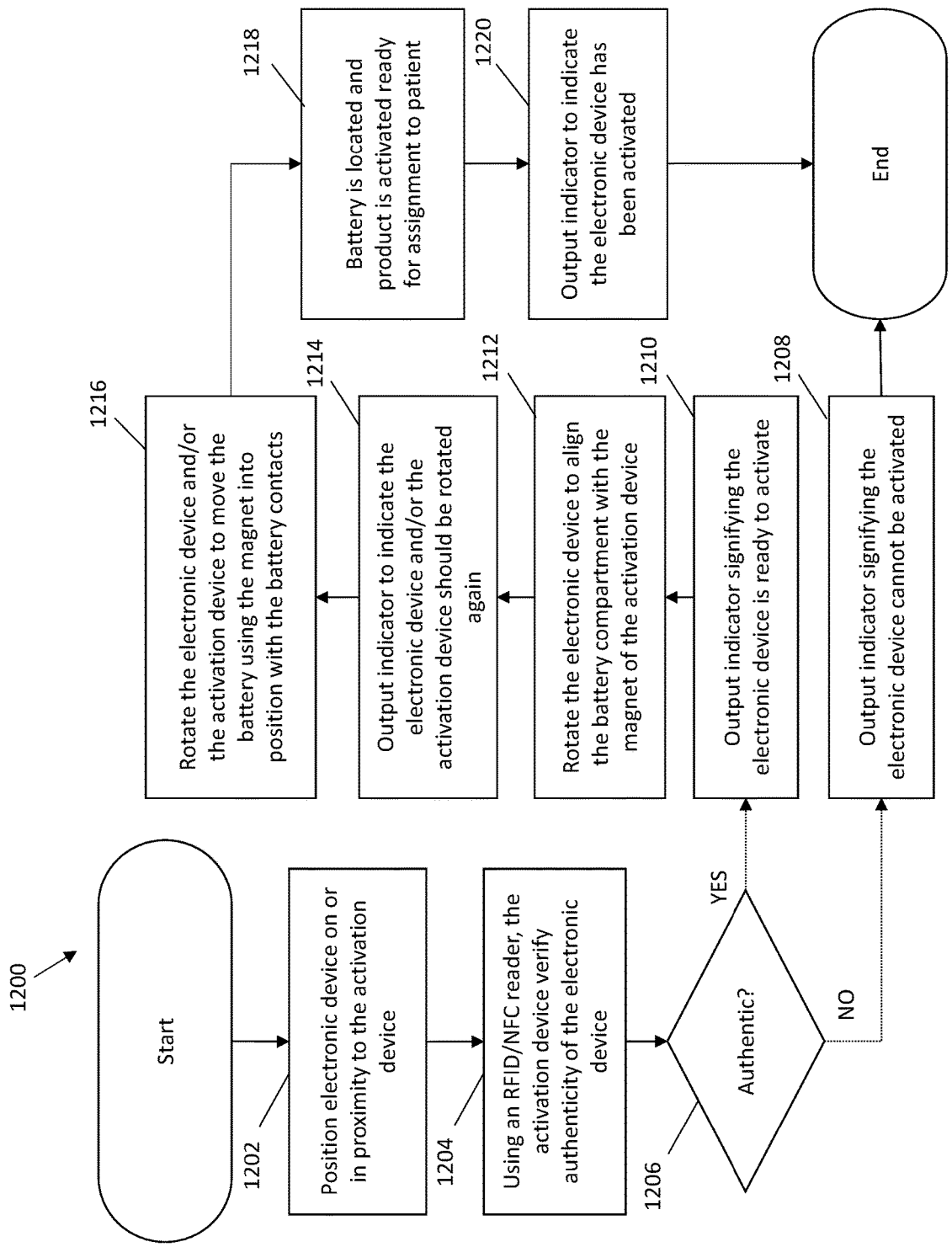
FIG. 12 is a flowchart illustrating an example process for displacing a battery within the housing of an embodiment of the electronic device using an embodiment of the activation device in accordance with embodiments of the present disclosure.

FIG. 12 is a flowchart illustrating an example process for displacing a battery within the housing of an electronic device (e.g., the electronic device 100) using an activation device (e.g., the activation device 130) in accordance with embodiments of the present disclosure. At operation 1202, the electronic device is positioned on or in proximity to the activation device. For example, a user can place the electronic device within a receiving area of the activation device. At operation 1204, a communication interface (e.g., communication interface 910) of the activation device can attempt to communicate with a first communication module (e.g., communication module 604) of the electronic device. For example, the communication module of the activation device can be an RFID/NFC reader and the first communication module of the electronic device can be an RFID/NFC module. The communication module can transmit an RF signal and the first communication can harvest power from the RF signal to power the first communication module. Using the power harvested from the RF signal, the first communication can output a response which can be received by the communication module of the activation device. The response can include an identifier of the first communication module and/or the electronic device. At operation 1206, a determination is made as to whether the electronic device is authentic. As one example, the activation device can include stored identifiers and can compare the received identifier to the stored identifiers, and if there is a match, the activation device can determine that the electronic device is authentic. As another example, the activation device can be in communication with a computing device and can transmit the received identifier to the computing device. The computing device can include stored identifiers and can compare the received identifier to the stored identifiers, and if there is a match, the activation device can determine that the electronic device is authentic. Alternatively, the computing device can be in communication with a server and the server can access a database that includes stored identifiers and can compare the received identifier to the stored identifiers, and if there is a match, the activation device can determine that the electronic device is authentic. As another example, the activation device can be in communication with the server without the computing device. At operation 1208, if it is determined that the electronic device is not authentic, an indicator can be output by the activation device and/or the computing device indicating that the electronic device cannot be activated and/or used.

At operation 1210, if it is determined that the electronic device is authentic, an indicator can be output by the activation device and/or the computing device indicating that the electronic device is ready to activate. At operation 1212, a first member (e.g., first member 410) of the activation device with the electronic device is rotated to align the battery (e.g., battery 114) positioned in the battery storage section (e.g., battery storage section 122) of the battery compartment (e.g., battery compartment 120) of the electronic device with the magnet (e.g., magnet 300) of the activation device. At operation 1214, an indicator is output by the activation device and/or the computing device to indicate that the first member with the electronic device should be rotated again. At operation 1216, the first member of the activation device with the electronic device is rotated to move the battery (via magnetic coupling between the magnet and the battery) from the battery storage section of the battery compartment to the battery engagement section (e.g., battery engagement section 124) of the battery compartment in the electronic device so that the battery is in electrical contact with the battery contacts (e.g., battery contacts 124 and 126). At operation 1218, the battery is positioned in the battery engagement section and the electronic device is activated. At operation 1220, an indicator is output by the electronic device, the activation device, and/or the computing device that the electronic device has been activated.

For embodiments in which the electronic device is a beaconing device for use in a location tracking system, the electronic device can be secured to an object, animal, or human (e.g., patient), etc., and the computing device and/or server can associate the electronic device with an object, animal, or human (e.g., patient), etc., so that the computing device and/or server can use beacon signals from the electronic device received by locators (RF transceivers) to determine the location of the electronic device and therefore determine the location of the object, animal, or human (e.g., patient), etc.

Figure 13A:
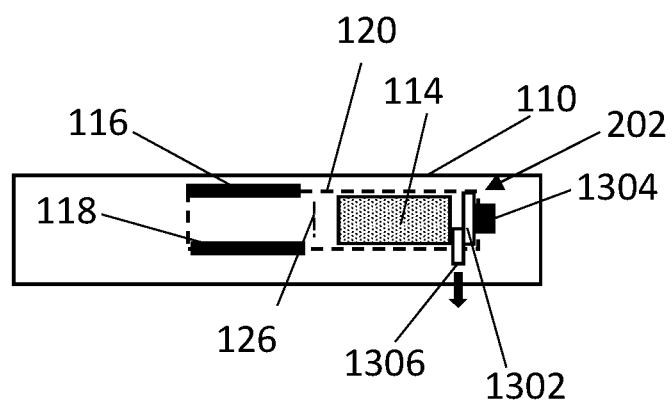
FIG. 13A-B are schematic views of an example electronic device and activation device in which a magnet of the activation device interacts with a latch assembly of the electronic device to activate the electronic device in accordance with embodiments of the present disclosure.
Figure 13B:
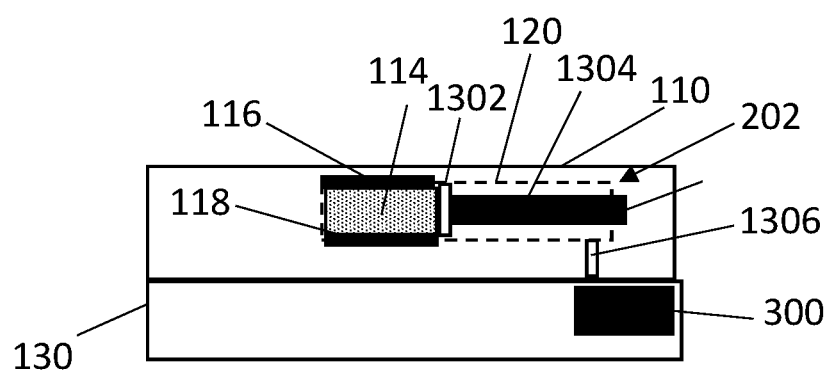

FIG. 13A-B are schematic views illustrating embodiments of the electronic device 100 and activation device 130 in which an activation element in the form of the magnet 300 of the activation device 130 causes the activation event which releases a pusher element 1302 that urges the battery 114 from the battery storage section 122 to the battery engagement section 124. As shown in FIGS. 13A-B, the pusher element 1302 can be disposed within the battery compartment 120 between the battery 114 and the terminal end 202 of the battery storage section 122. The pusher element 1302 can be operatively coupled to a spring member 1304, which can be maintained in a compressed state by a latch assembly 1306 when the latch assembly 1306 is the locked position shown in FIG. 13A. As shown in FIG. 13B, the magnet 300 of the activation device 130 can be positioned in proximity to the latch assembly 1306 and can magnetically couple with the latch assembly 1306. The magnetic field generated by the magnet 300 can cause the latch assembly 1306 to move from the locked position (shown in FIG. 13A) to the unlocked position (shown in FIG. 13B). In response, the spring member 1304 can be released and the force of the spring can urge the pusher element 1302 towards the battery engagement area pushing the battery 114 into the battery engagement section 124 past the resilient members 126 (and overcoming the threshold force of the resilient members 126) as shown in FIG. 13B.

Figure 14A:
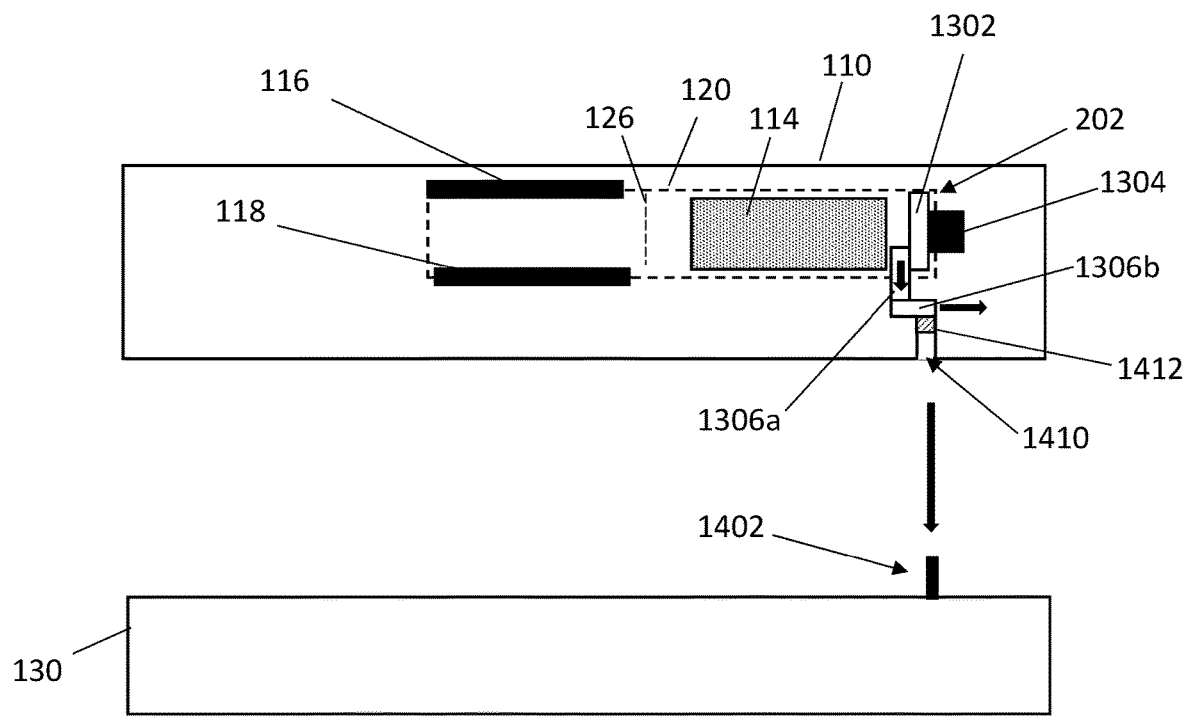
FIG. 14A-B are schematic views of an example electronic device and activation device in which a pin of the activation device interacts with a latch assembly of the electronic device to activate the electronic device in accordance with embodiments of the present disclosure.
Figure 14B:
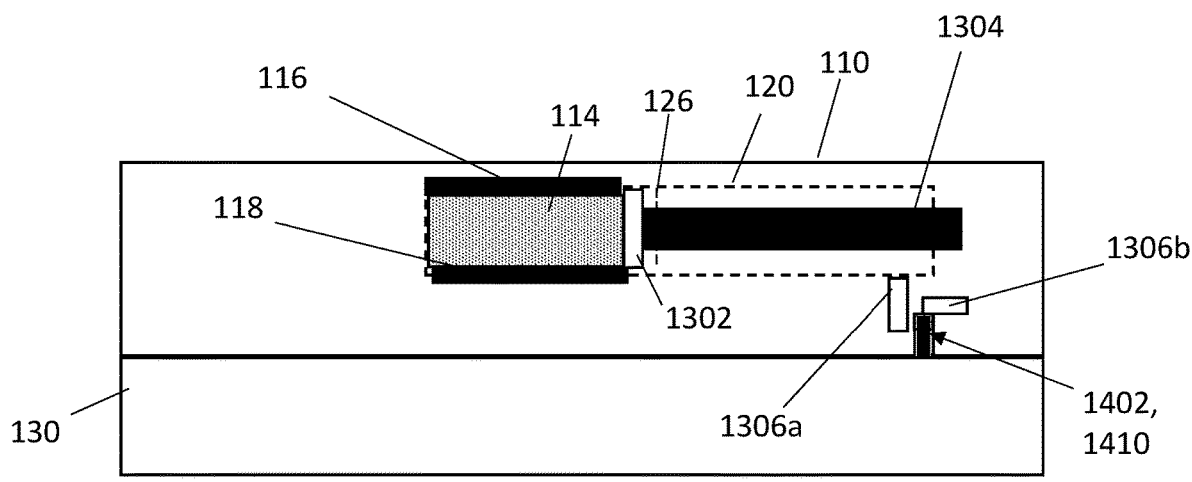

FIG. 14A-B are schematic views illustrating embodiments of the electronic device 100 and activation device 130 in which an activation element in the form of a pin 1402 of the activation device 130 engages with a recess 1410 in the housing 110 of the electronic device 100 causing the activation event which releases the pusher element 1302 that urges the battery 114 from the battery storage section 122 to the battery engagement section 124. The recess 1410 can include a membrane 1412 disposed at a distal end that allows the pin 1402 to engage a latch assembly 1306a-b without requiring the pin to have direct contact with the latch assembly 1306a-b and providing a sealed housing that prevents fluid and/or debris from entering the housing 110. As shown in FIG. 14B, the pin 1402 of the activation device 130 can be positioned in the recess 1410 to engage the latch assembly 1306a-b. The pin 1402 can cause the latch assembly 1306a-b to move from the locked position (shown in FIG. 14A) to the unlocked position (shown in FIG. 14B). In response, the spring member 1304 can be released and the force of the spring can urge the pusher element 1302 towards the battery engagement area pushing the battery 114 into the battery engagement section 124 past the resilient members 126 (and overcoming the threshold force of the resilient members 126) as shown in FIG. 14B.

Figure 15A:
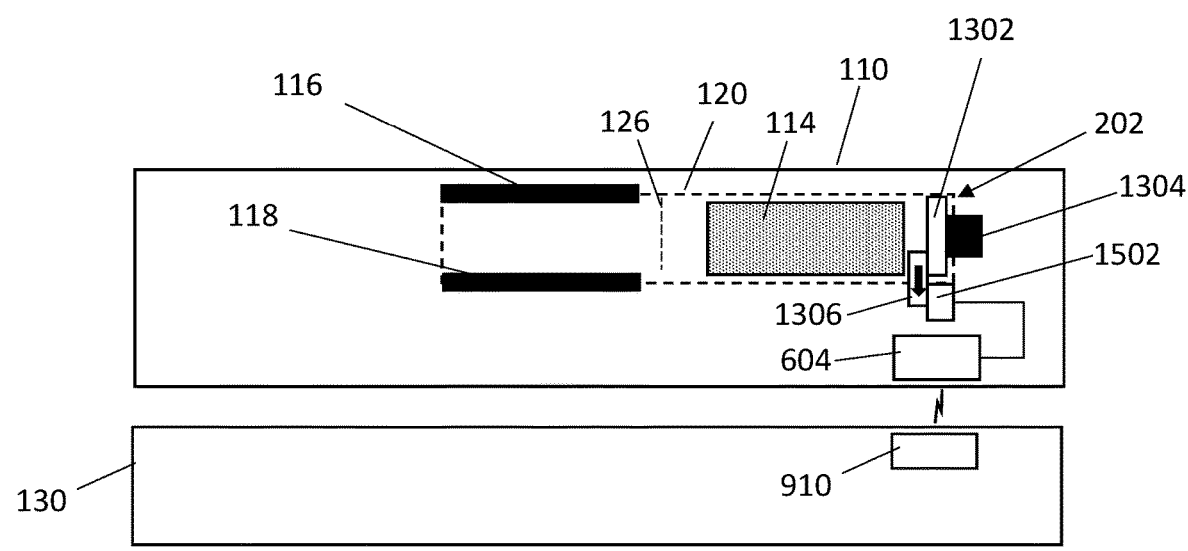
FIG. 15A-B are schematic views of an example electronic device and activation device in which a communication interface of the activation device communications with a communication module of the electronic device to actuate a latch assembly of the electronic device and activate the electronic device in accordance with embodiments of the present disclosure.
Figure 15B:
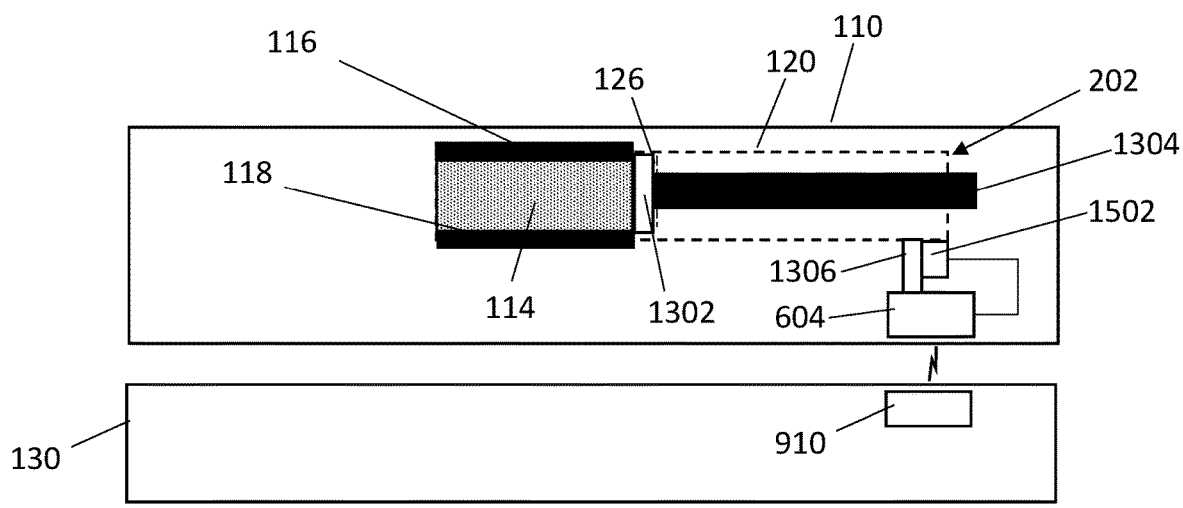

Referring to FIGS. 8, 9, and 15A-B are schematic views illustrating embodiments of the electronic device 100 and activation device 130 in which an activation element in the form of the communication interface 910 of the activation device 130 causes the activation event which releases the pusher element 1302 that urges the battery 114 from the battery storage section 122 to the battery engagement section 124. As shown in FIGS. 15A-B, the pusher element 1302 can be disposed within the battery compartment 120 between the battery 114 and the terminal end 202 of the battery storage section 122. The pusher element 1302 can be operatively coupled to the spring member 1304, which can be maintained in a compressed state by a latch assembly 1306 when the latch assembly 1306 is the locked position shown in FIG. 15A. The latch assembly can be actuated by an actuator 1502 (e.g., solenoid, motor, piezoelectric, etc.) to cause the latch assembly 1306 to move from the locked position to the unlocked position. In response to moving the latch assembly to the unlocked position, the spring member 1304 can be released and the force of the spring member 1304 can urge the pusher element 1302 towards the battery engagement section 124 pushing the battery 114 into the battery engagement section 124 past the resilient members 126 (and overcoming the threshold force of the resilient members 126) as shown in FIG. 15B.

Still referring to FIGS. 8, 9, and 15A-B, the actuator 1502 can be controlled by the logic circuit 820 of the communications module 604, e.g., shown in FIG. 8. In one example, the communication interface 910 of the activation device 130, e.g., shown in FIG. 9, can interrogate the communication module 604 of the electronic device 100 with a radiofrequency signal. The communication module 604 can harvest energy from the radiofrequency signal to power the communication module 604 and the logic circuit 820 can be programmed to control the actuator 1502 in response to the harvested energy and/or a command encoded in the radiofrequency signal. The logic circuit 850 can also output a response to interrogation of the activation device 130 (e.g., including the identifier). In another example, the communication interface 910 of the activation device 130 can interrogate the communication module 604 of the electronic device 100 with a radiofrequency signal that includes activation data to be stored in the memory 850 of the communications module 604. The communication module 604 can harvest energy from the radiofrequency signal to power the communication module 604 and the logic circuit 820 can store the activation data in the memory 850 and the logic circuit 820 can be programmed to control the actuator 1502 in response to the activation data being stored in the memory. The logic circuit 850 can also output a response to interrogation to the activation device 130 (e.g., include the identifier). In some examples, multiple interrogations can be used, e.g., to ensure that the communications module 604 has sufficient energy for performing operations. For example, the logic circuit 820 can be powered by energy harvested from a first interrogation, and in response, can be programmed to first check the memory 850 for the activation data and if the activation data is not already stored in memory can perform other operations in response to the first interrogation. The first interrogation can include the radiofrequency signal encoded with activation data to be stored in the memory 850. Since the activation data is not stored in the memory 850 prior to the first interrogation, after initially checking the memory 850 for the activation data, the logic circuit 820 can process the first interrogation and proceed to store the activation data in the memory 850 and response to the first interrogation by outputting the identifier to the activation device 130. In response to a second interrogation, the logic circuit 820 can be powered by energy harvested from a second interrogation (a second radiofrequency signal from the communication interface 910 of the activation device 130), and in response, can be programmed to first check the memory 850 for the activation data. Since the activation data is already stored in the memory 850, the logic circuit 820 can the logic circuit 820 can be programmed to control the actuator 1502 in response to the activation data being stored in the memory 850. The logic circuit 820 can also output a response to the activation device 130 in response to the second interrogation and/or erase the activation data from the memory 850.

Figure 16:
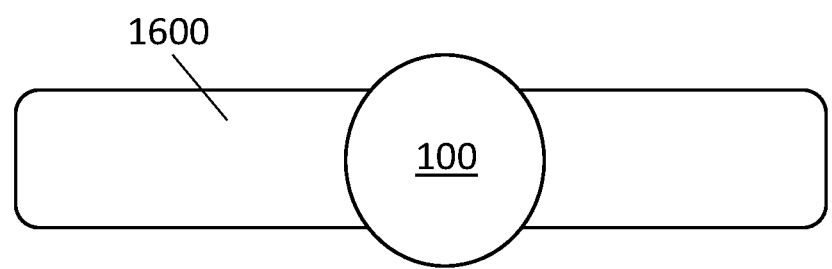
FIG. 16 illustrates an example of an embodiment of the electronic device secured to a band in accordance with embodiments of the present disclosure.

FIG. 16 illustrates an example of an embodiment of the electronic device 100 secured to a band 1600 in accordance with embodiments of the present disclosure. The band 1600 (e.g., a wristband) can be configured to wrapped about an object, a limb of an animal or human, etc., to secure the electronic device to the object, animal, human, etc. As one example, the electronic device 100 can be authenticated and/or activated as described herein and can output beacon messages that can be used to track a location of the electronic device 100 and/or the wearer of the band.

The above description refers to a block diagram of the accompanying drawings. Alternative implementations of the example represented by the block diagram includes one or more additional or alternative elements, processes and/or devices. Additionally or alternatively, one or more of the example blocks of the diagram may be combined, divided, re-arranged or omitted. Components represented by the blocks of the diagram are implemented by hardware, software, firmware, and/or any combination of hardware, software and/or firmware. In some examples, at least one of the components represented by the blocks is implemented by a logic circuit. As used herein, the term "logic circuit" is expressly defined as a physical device including at least one hardware component configured (e.g., via operation in accordance with a predetermined configuration and/or via execution of stored machine-readable instructions) to control one or more machines and/or perform operations of one or more machines. Examples of a logic circuit include one or more processors, one or more coprocessors, one or more microprocessors, one or more controllers, one or more digital signal processors (DSPs), one or more application specific integrated circuits (ASICs), one or more field programmable gate arrays (FPGAs), one or more microcontroller units (MCUs), one or more hardware accelerators, one or more special-purpose computer chips, and one or more system-on-a-chip (SoC) devices. Some example logic circuits, such as ASICs or FPGAs, are specifically configured hardware for performing operations (e.g., one or more of the operations described herein and represented by the flowcharts of this disclosure, if such are present). Some example logic circuits are hardware that executes machine-readable instructions to perform operations (e.g., one or more of the operations described herein and represented by the flowcharts of this disclosure, if such are present). Some example logic circuits include a combination of specifically configured hardware and hardware that executes machine-readable instructions. The above description refers to various operations described herein and flowcharts that may be appended hereto to illustrate the flow of those operations. Any such flowcharts are representative of example methods disclosed herein. In some examples, the methods represented by the flowcharts implement the apparatus represented by the block diagrams. Alternative implementations of example methods disclosed herein may include additional or alternative operations. Further, operations of alternative implementations of the methods disclosed herein may combined, divided, re-arranged or omitted. In some examples, the operations described herein are implemented by machine-readable instructions (e.g., software and/or firmware) stored on a medium (e.g., a tangible machine-readable medium) for execution by one or more logic circuits (e.g., processor(s)). In some examples, the operations described herein are implemented by one or more configurations of one or more specifically designed logic circuits (e.g., ASIC(s)). In some examples the operations described herein are implemented by a combination of specifically designed logic circuit(s) and machine-readable instructions stored on a medium (e.g., a tangible machine-readable medium) for execution by logic circuit(s).

As used herein, each of the terms "tangible machine-readable medium," "non-transitory machine-readable medium" and "machine-readable storage device" is expressly defined as a storage medium (e.g., a platter of a hard disk drive, a digital versatile disc, a compact disc, flash memory, read-only memory, random-access memory, etc.) on which machine-readable instructions (e.g., program code in the form of, for example, software and/or firmware) are stored for any suitable duration of time (e.g., permanently, for an extended period of time (e.g., while a program associated with the machine-readable instructions is executing), and/or a short period of time (e.g., while the machine-readable instructions are cached and/or during a buffering process)). Further, as used herein, each of the terms "tangible machine-readable medium," "non-transitory machine-readable medium" and "machine-readable storage device" is expressly defined to exclude propagating signals. That is, as used in any claim of this patent, none of the terms "tangible machine-readable medium," "non-transitory machine-readable medium," and "machine-readable storage device" can be read to be implemented by a propagating signal.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings. Additionally, the described embodiments/examples/implementations should not be interpreted as mutually exclusive and should instead be understood as potentially combinable if such combinations are permissive in any way. In other words, any feature disclosed in any of the aforementioned embodiments/examples/implementations may be included in any of the other aforementioned embodiments/examples/implementations.

The benefits, advantages, solutions to problems, and any element(s) that may cause any benefit, advantage, or solution to occur or become more pronounced are not to be construed as a critical, required, or essential features or elements of any or all the claims. The claimed invention is defined solely by the appended claims including any amendments made during the pendency of this application and all equivalents of those claims as issued.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus, the following claims are hereby incorporated into the Detailed Description, with each claim standing on its own as a separately claimed subject matter.

The invention claimed is:

1. A system comprising:
   an electronic device, the electronic device including:
      a battery compartment including a battery storage section and a battery engagement section, the battery engagement section including battery contacts;
      a battery disposed in the battery storage section of the battery compartment, the battery moves from the battery storage section to the battery engagement section in response to an activation event to place the battery in electrical contact with the battery contacts;
      a pusher element;
      a spring; and
      a latch assembly having a locked position and an unlocked position an activation device, the activation device including:
      a magnet configured to generate the activation event, the magnetic field of the magnet causes the latch assembly to move from the locked position to the unlocked position, and in response to the latch assembly being moved to the unlocked position, the spring member urges the pusher element against the battery to move the battery from the battery storage section to the battery engagement section.

2. The system of claim 1, wherein the electronic device further comprises:
   a retaining member disposed between the battery storage section and the battery engagement section, the retaining member inhibiting movement of the battery from the battery storage section to the battery engagement section.

3. The system of claim 2, wherein in response to the activation event, the battery exerts a force on the retaining member that displaces or deforms the retaining member so that the battery moves past the retaining member and into the battery engagement section in response to the activation event.

4. The system of claim 1, wherein an interior volume of the battery compartment is inaccessible.

5. The system of claim 1, further comprising:
   a housing, the electric circuit and the battery compartment being disposed in the housing, the housing being sealed to prevent access to the interior volume of the battery compartment.

6. The system of claim 1, wherein the electronic device further comprises:
   an electric circuit electrically coupled to the battery contacts,
   the electrical circuit including a first communication module and a second communication module,
   the first communication module is operable when the battery is in the battery storage section, and
   the second communication module is inoperable when the battery is in the battery storage section.

7. An electronic device comprising:
   an electric circuit;
   a battery compartment including a battery storage section and a battery engagement section, the battery engagement section including battery contacts that are electrically connected to the electric circuit;
   a battery disposed in the battery storage section of the battery compartment, the battery moves from the battery storage section to the battery engagement section in response to an activation event to place the battery in electrical contact with the battery contacts;
   a pusher element;
   a spring; and
   a latch assembly having a locked position and an unlocked position,
   wherein the activation event corresponds to a magnet being position in proximity of the latch and the magnetic field of the magnet causes the latch assembly to move from the locked position to the unlocked position, and in response to the latch assembly being moved to the unlocked position, the spring member urges the pusher element against the battery to move the battery from the battery storage section to the battery engagement section.

8. The electronic device of claim 7, further comprising:
a retaining member disposed between the battery storage section and the battery engagement section, the retaining member inhibiting movement of the battery from the battery storage section to the battery engagement section.

9. The electronic device of claim 8, wherein in response to the activation event, the battery exerts a force on the retaining member that displaces or deforms the retaining member so that the battery moves past the retaining member and into the battery engagement section in response to the activation event.

10. The electronic device of claim 7, wherein the activation event corresponds to a movement of the electronic device.

11. The electronic device of claim 7, wherein an interior volume of the battery compartment is inaccessible.

12. The electronic device of claim 7, further comprising:
a housing, the electric circuit and the battery compartment being disposed in the housing, the housing being sealed to prevent access to the interior volume of the battery compartment.

13. The electronic device of claim 7, wherein the electric circuit comprises:
a first communications module that is electrically isolated from the battery contacts; and
a second communications module that is electrically connected to the battery contacts,
the first communications module is operable and the second communications module is inoperable when the battery is in the battery storage section.

14. The electronic device of claim 13, wherein the first communications module is one of a near-field communication (NFC) circuit or a radiofrequency identification (RFID) circuit and the second communications module is a Bluetooth circuit.

* * * * *